(12) United States Patent
Liao et al.

(10) Patent No.: US 10,132,835 B2
(45) Date of Patent: Nov. 20, 2018

(54) TESTING APPARATUS AND ITS PROBE CONNECTOR

(71) Applicants: GLOBAL UNICHIP CORPORATION, Hsinchu (TW); TAIWAN SEMICONDUCTOR MANUFACTURING CO., LTD., Hsinchu (TW)

(72) Inventors: Chih-Chieh Liao, Taipei (TW); Yu-Min Sun, New Taipei (TW); Chih-Feng Cheng, Taoyuan (TW)

(73) Assignees: GLOBAL UNICHIP CORPORATION, Hsinchu, Taiwan (TW); TAIWAN SEMICONDUCTOR MANUFACTURING CO., LTD., Hsinchu, Taiwan (TW)

( * ) Notice: Subject to any disclaimer, the term of this patent is extended or adjusted under 35 U.S.C. 154(b) by 122 days.

(21) Appl. No.: 15/297,160

(22) Filed: Oct. 19, 2016

(65) Prior Publication Data
US 2018/0038892 A1   Feb. 8, 2018

(30) Foreign Application Priority Data
Aug. 4, 2016   (CN) .......................... 2016 1 0630645

(51) Int. Cl.
*G01R 1/067*   (2006.01)
(52) U.S. Cl.
CPC .............................. *G01R 1/06783* (2013.01)

(58) Field of Classification Search
CPC .......... G01R 33/20; G01V 3/32; A61B 5/055; G01N 24/00
USPC ........ 324/252, 307, 311, 300, 200, 301, 309
See application file for complete search history.

(56) References Cited

U.S. PATENT DOCUMENTS

| | | | |
|---|---|---|---|
| 9,910,053 B2* | 3/2018 | Bakhru | G01N 33/4905 |
| 2014/0320144 A1* | 10/2014 | Nakaya | H01M 10/54 324/434 |
| 2015/0190659 A1* | 7/2015 | Kohler | A61N 7/02 600/411 |
| 2017/0234945 A1* | 8/2017 | Findeklee | G01R 33/288 324/313 |
| 2017/0264110 A1* | 9/2017 | Toya | H02J 7/0021 |
| 2017/0319097 A1* | 11/2017 | Amthor | A61B 5/055 |

FOREIGN PATENT DOCUMENTS

CN   105092908 A   11/2015

* cited by examiner

*Primary Examiner* — Giovanni Astacio-Oquendo
(74) *Attorney, Agent, or Firm* — CKC & Partners Co., Ltd.

(57) ABSTRACT

A probe connector includes a probe body, a flexible sleeve body, a slit and a conductive fluid. The flexible sleeve body is connected to the probe body. The conductive fluid is received in the flexible sleeve body and electrically connected to the slit and the probe body. The slit is formed on one end of the flexible sleeve body opposite to the probe body, so as to define petal portions which are configured to be tightly closed together. When the slit is pressed to separate the petal portions, a portion of the conductive fluid seeps up from the flexible sleeve body via the slit.

16 Claims, 5 Drawing Sheets

TESTING APPARATUS AND ITS PROBE CONNECTOR

RELATED APPLICATIONS

This application claims priority to China Application Serial Number 201610630645.2, filed Aug. 4, 2016, which is herein incorporated by reference.

BACKGROUND

Field of Disclosure

The present disclosure relates to a probe connector and a testing apparatus. More particularly, the present disclosure relates to a probe connector and a testing apparatus using a fluid conductor to touch conductive contacts.

Description of Related Art

In order to measure electrical features of a semiconductor device, the semiconductor device is required to be connected stably with a testing apparatus. In general, when the test apparatus tests a device under test (DUT), a test circuit of the testing apparatus is required to contact and press electrical contacts (e.g., terminals, soldering pads or soldering balls) of the DUT through probe pins of the testing apparatus to exchange testing signals between the test circuit and the DUT.

However, because the probe pins of the testing apparatus frequently physically touch and press the electrical contacts of the DUT, scratches or/and pressing marks are likely to be formed on the probe pins or/and the electrical contacts, thus reducing the electrical capabilities of the probe pins, further lowering the quality of electrical signal transmission and operation life of the probe pins.

SUMMARY

An aspect of the disclosure is to provide a testing apparatus and its probe connector to overcome the aforementioned defects and inconvenience of the prior art, by reducing the possibilities of forming scratches or/and pressing marks on the probe pins or/and the electrical contacts, so as to maintain the quality of electrical signal transmission and the operation life of the probe connector.

In one embodiment, a probe connector includes a probe body, a flexible sleeve body, at least one slit and a conductive fluid. The probe body is provided with a contacting portion at one end thereof. The flexible sleeve body is connected to one end of the probe body opposite to the contacting portion. The conductive fluid is extrudably received in the flexible sleeve body and electrically connected to the probe body. The slit is formed at one end of the flexible sleeve body opposite to the probe body, so as to define a plurality of petal portions which are configured to be tightly closed together. When the slit is pressed to separate the petal portions, a portion of the conductive fluid seeps up from the flexible sleeve body via the slit, when the slit is not pressed, the portion of the conductive fluid returns back into the flexible sleeve body via the slit.

In another embodiment, a testing apparatus includes a host, a testing circuit and at least one probe connector. The testing circuit is connected to the host, and the testing circuit includes a first conductive contact. The probe connector includes a probe body, a flexible sleeve body, a slit and a conductive fluid. The probe body is provided with a contacting portion at one end thereof. The flexible sleeve body is connected to one end of the probe body opposite to the contacting portion. The conductive fluid is extrudably received in the flexible sleeve body and electrically connected to the probe body. The slit is formed at one end of the flexible sleeve body opposite to the probe body, so as to define petal portions which are configured to be tightly closed together. When a device under test (DUT) presses the slit to separate the petal portions with one second conductive contact of the DUT, a portion of the conductive fluid seeps up from the flexible sleeve body via the slit and is electrically connected to the second conductive contact; and when the DUT does not push the slit anymore, the portion of the conductive fluid returns back into the flexible sleeve body via the slit.

Therefore, the probe connector of the embodiment is electrically connected to a conductive contact of the DUT with the conductive fluid seeping up from the flexible sleeve body. Since the hardness of the conductive fluid is smaller than the hardness of a conventional solid probe pin, the possibilities of resulting in scratches or/and pressing marks on the probe pins or/and the electrical contacts can be reduced, so as to protect the probe pins or/and the electrical contacts and to maintain the quality of electrical signal transmission and the operation life of the probe connector.

It is to be understood that both the foregoing general description and the following detailed description are by examples, and are intended to provide further explanation of the disclosure as claimed.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure. In the drawings.

DESCRIPTION OF THE EMBODIMENTS

Figure 1:
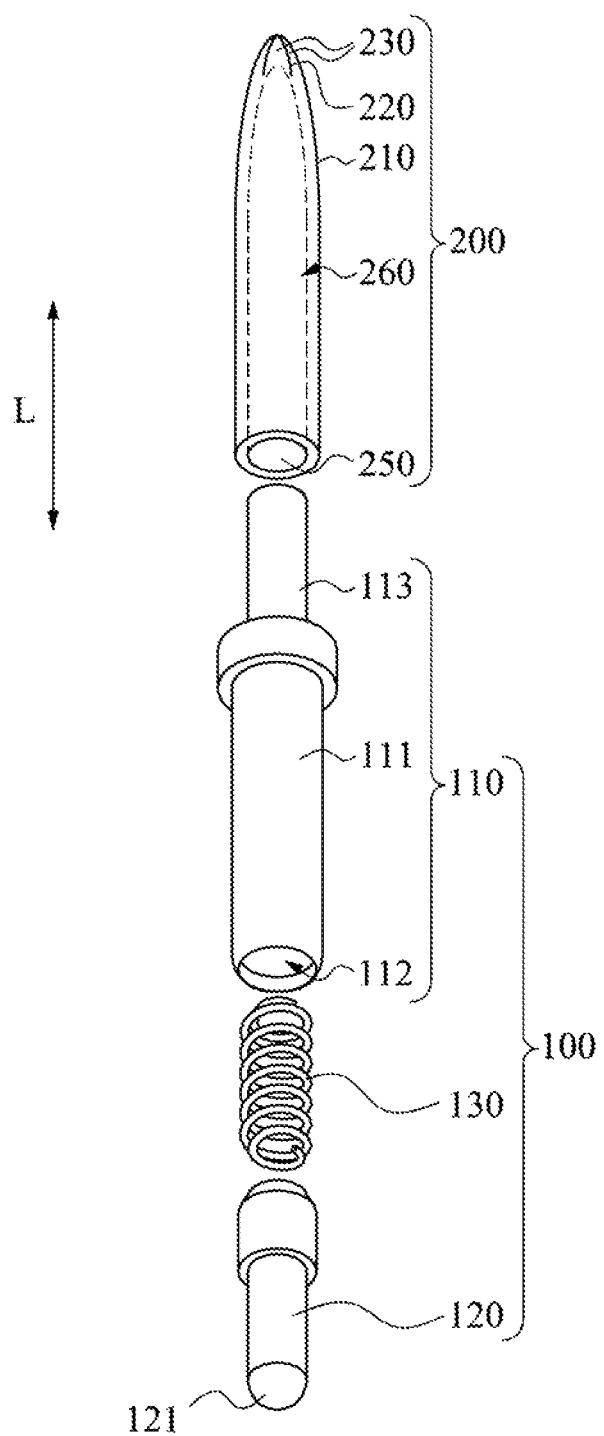
FIG. 1 is an exploded view of a probe connector according to one embodiment of the disclosure.

Reference will now be made in detail to the present embodiments of the disclosure, examples of which are illustrated in the accompanying drawings. Wherever possible, the same reference numbers are used in the drawings and the description to refer to the same or like parts. According to the embodiments, it will be apparent to those skilled in the art that various modifications and variations can be made to the structure of the present disclosure without departing from the scope or pirit of the disclosure.

Figure 2:
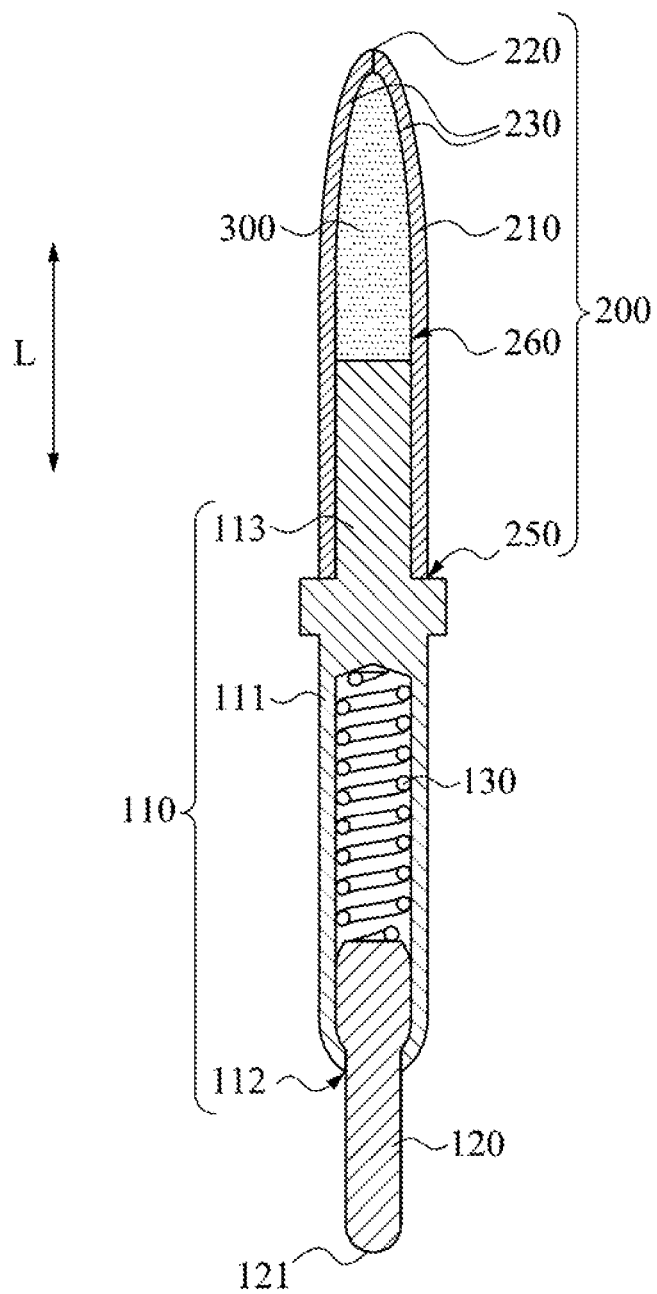
FIG. 2 is a cross-sectional view of the probe connector of FIG. 1.

Reference is now made to FIG. 1 and FIG. 2, in which FIG. 1 is an exploded view of a probe connector 10 according to one embodiment of the disclosure, and FIG. 2 is a cross-sectional view of the probe connector 10 of FIG. 1. In this embodiment, the probe connector 10 includes a probe body 100, a flexible sleeve body 200 (e.g., a rubber or plastic sleeve) and a conductive fluid 300. The flexible sleeve body 200 is connected to one end of the probe body 100. The conductive fluid 300 is extrudably received in an internal space of the flexible sleeve body 200 and electrically connected to the probe body 100. The flexible sleeve body 200 is formed with some slits 220. The slits 220 are formed at one end of the flexible sleeve body 200 opposite to the probe body 100, such that a portion of the conductive fluid 300 can seeps up from the internal space of the flexible sleeve body 200 via the slits 220 when the slits 220 are presses by an external force.

As shown in FIG. 1 and FIG. 2, in this embodiment, specifically, the flexible sleeve body 200 is provided with a main body 210 and an end opening 250. The end opening 250 and the slits 220 are respectively formed on two opposite end portions of the main body 210. The main body 210 is further provided with an inner passage 260 for accommodating the conductive fluid 300. A longitudinal direction L of the inner passage 260 is the same as a longitudinal direction L of the main body 210, and the inner passage 260 is connected to and communicates with the end opening 250 and the slits 220. The main body 210 is a soft sleeve which can be pressed for compressing the inner passage 260. The soft sleeve, for example, can be a rubber or plastic sleeve.

In this embodiment, the number of the slits 220 is more than one, and the slits 220 intersect with each other so as to define petal portions 230 which are configured to be tightly closed together on the main body 210. Before the slits 220 are pressed by the external force, since the petal portions 230, at this moment, are closed together to seal the slits 220, the inner passage 260 cannot communicate with the external of the flexible sleeve body 200 via the slits 220, that is, the closed petal portions 230 collaborate to stop the conductive fluid 300 from leaking out of the flexible sleeve body 200 via the slits 230.

Furthermore, in the embodiment, the probe body 100 includes a conductive pin rod 110, a pin shaft 120 and an elastic member 130. The conductive pin rod 110 includes a cylindrical body 111, a recess 112 and an extending column 113. The recess 112 and the extending column 113 are respectively formed on two opposite ends of the cylindrical body 111. The pin shaft 120 is retractably disposed in the recess 112, and the pin shaft 120 partially extends outwards from the recess 112. Specifically, one distal end of the pin shaft 120 extending outwards from the recess 112 and opposite to the flexible sleeve body 200 is provided with a contacting portion 121. The elastic member 130, for example, a telescopic spring, is disposed in the recess 112, and is connected to the pin shaft 120 and an inner surface of the recess 112 of the cylindrical body 111, respectively. Also, the extending column 113 is inserted into the inner passage 260 via the end opening 250, and hermetically closes one end of the inner passage 260 for blocking the conductive fluid 300 from flowing outwards from the inner passage 260 via the end opening 250. Since the longitudinal directions L of the conductive pin rod 110, the pin shaft 120 and the elastic member 130 (e.g., telescopic spring) are the same, when the pin shaft 120 is retracted, the elastic member 130 and the pin shaft 120 are moved in the same direction.

The conductive fluid 300 is a liquid metal having non-solid and low hardness characteristic for reducing the possibilities of forming scratches or/and pressing marks on the probe pins or/and the electrical contacts.

For example, the conductive fluid 300 is a liquid metal which is not solid under a room temperature. The liquid metal includes one or more materials selected from a group consisting of gallium, cesium, indium, mercury, tin, lead, zinc and bismuth, and an alloy thereof such as gallium indium alloy, or gallium-tin alloy. For example, a melting point of gallium is 29.8° C., a melting point of cesium is 28° C., a melting point of mercury is −39° C.; or, another example, a melting point of gallium indium alloy is 16° C., and the melting point of the gallium-tin alloy is 20° C.

Figure 3:
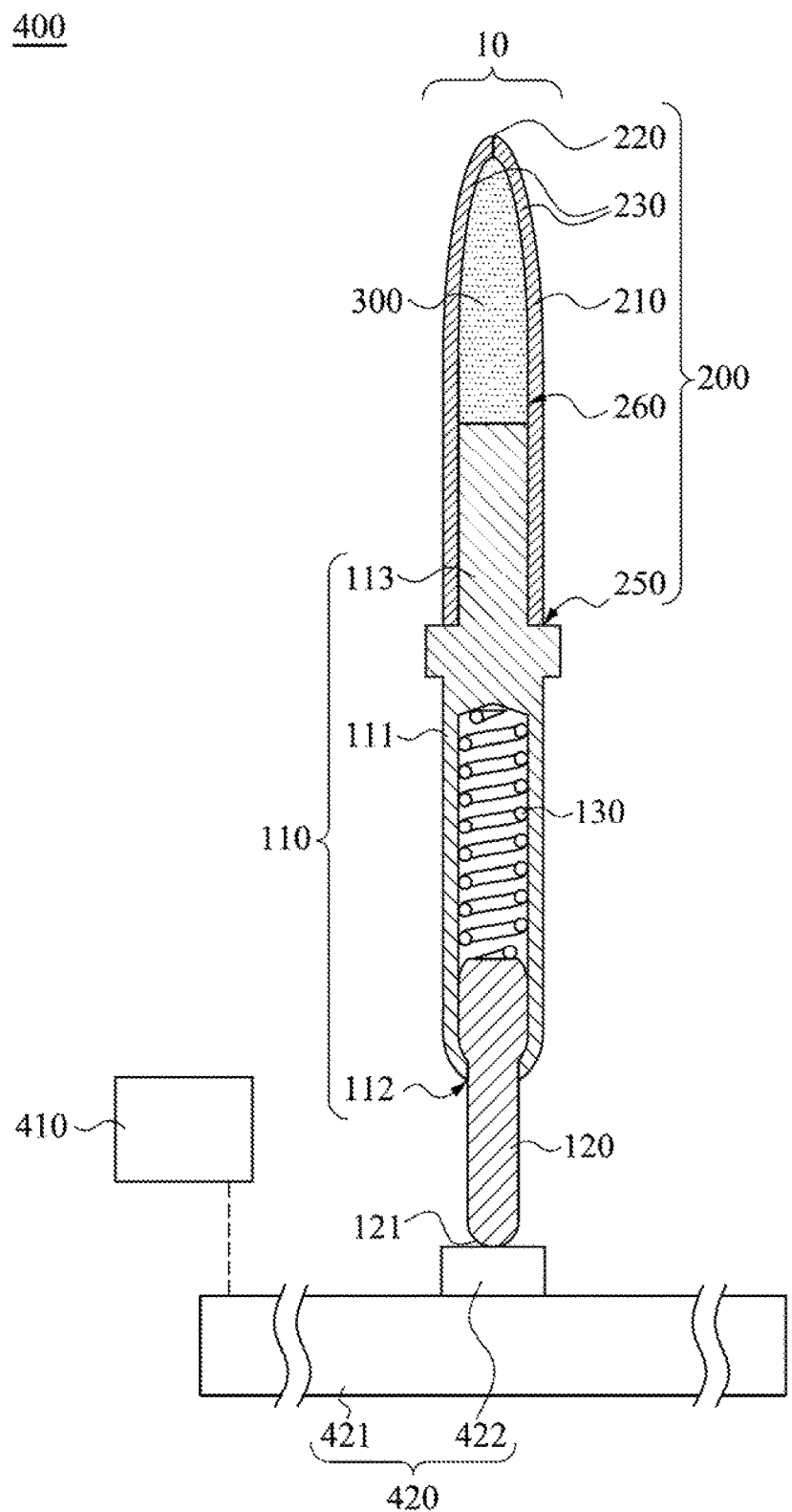
FIG. 3 is a cross-sectional view of a testing apparatus according to one embodiment of the disclosure.

FIG. 3 is a cross-sectional view of a testing apparatus 400 according to one embodiment of the disclosure. As shown in FIG. 3, the testing apparatus 400 includes a host 410, a testing circuit 420 and at least one of the aforementioned probe connector 10 and a support (not shown in the figures) The host 410, for example, is a testing computer or alike. The testing circuit 420 is connected to the host 410. The testing circuit 420 includes a wiring board 421 and at least one first conductive contact 422. The first conductive contact 422, for example, is a soldering pad. The first conductive contact 422 is arranged on one surface of the wiring board 421, and the first conductive contact 422 is electrically connected to the host 410 through the wiring board 421. The support is connected to the probe connector 10, and supports the probe connector 10 above the testing circuit 420, such that the pin shaft 120 of the probe connector 10 can be electrically connected to the first conductive contact 422 through the contacting portion 121. Since the support is well known in the related field, the support are not described herein.

Figure 4:
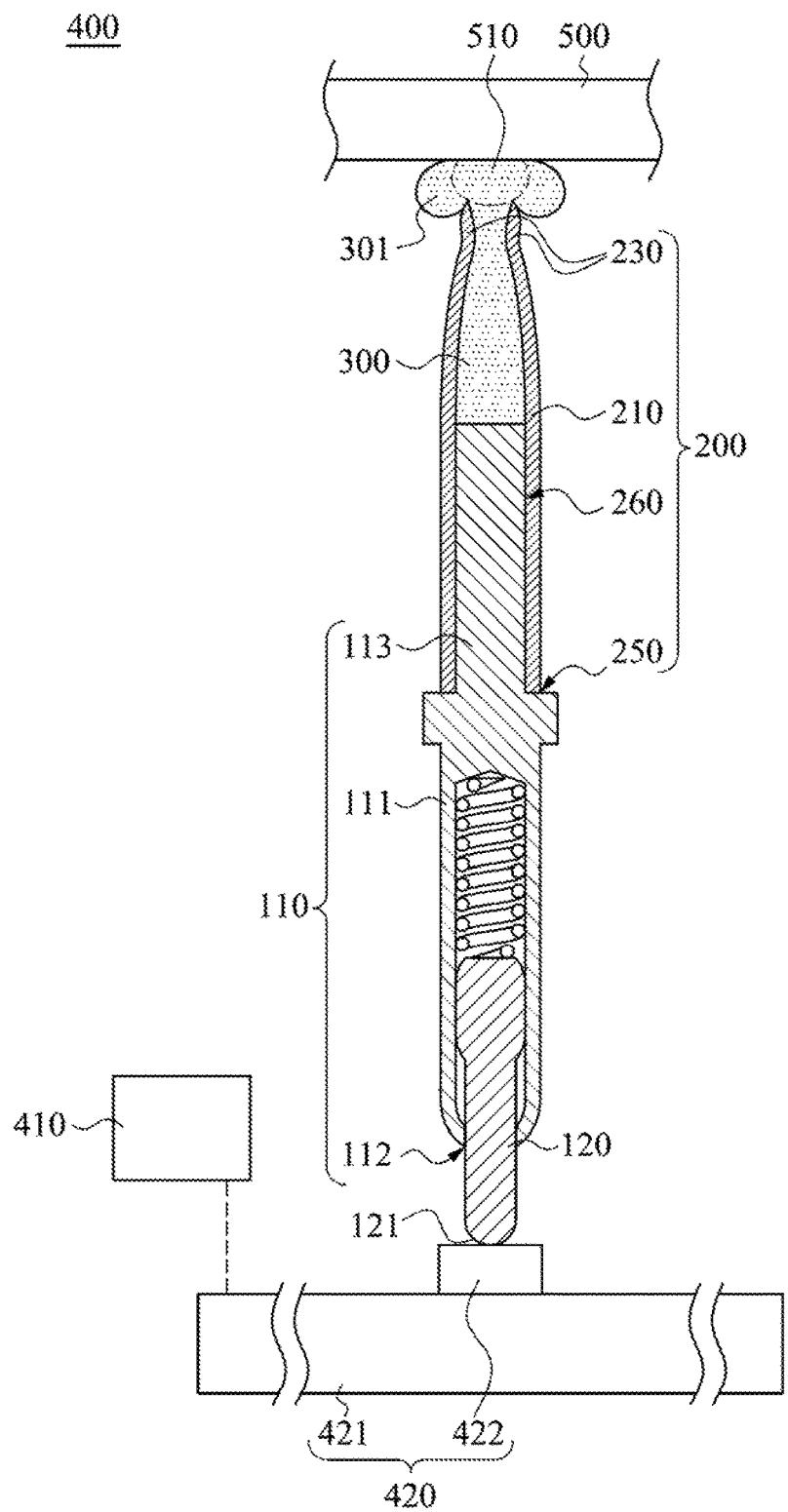
FIG. 4 is an operational schematic view of the testing apparatus of FIG. 3.

FIG. 4 is an operational schematic view of the testing apparatus 400 of FIG. 3. As shown in FIG. 3 and FIG. 4, the testing apparatus 400 is used to test at least one device under test (DUT) 500. When the DUT 500 presses the slits 220 of the flexible sleeve body 200 of the probe connector 10 (FIG. 3) to separate the petal portions 230 from one of second conductive contacts 510 (e.g., terminals, soldering pads or soldering balls) of the DUT 500, in response thereto, a portion 301 of the conductive fluid 300 is seeps up from the flexible sleeve body 200 via the slits 220 and is electrically connected to the second conductive contact 510, such that the host 410 can test the DUT 500. On the other hand, when the DUT 500 does not press the slits 220 anymore, in response thereto, the portion 301 of the conductive fluid 300 substantially returns back into the inner passage 260 of the flexible sleeve body 200 via the slits 220 before the petal portions 230 resume to be tightly closed together.

Thus, ince the probe connector 10 of the embodiment is electrically connected to a conductive contact 422 of the DUT 500 with the conductive fluid 300 seeping up from the flexible sleeve body 200, and the conductive fluid 300 is in liquid, slurry or gel state, the hardness of the conductive fluid 300 is much smaller than the hardness of a conventional solid probe pin. Therefore, the conductive fluid 300 not only can contact a greater surface area of the second conductive contact 510, but also can reduce possibilities of causing scratches or/and pressing marks on the probe connector 10 or/and the second conductive contact 510 of the DUT 500, so as to protect the probe connector 10 or/and the second conductive contact 510 of the DUT 500 from being scratched, and maintain the quality of electrical signal transmission and the operation life of the probe connector 10.

In this embodiment, since the conductive fluid is a liquid metal which is not solid under the room temperature, that is, the conductive fluid can be liquefied/melted at the room temperature without heating, the characteristics of non-solid and low hardness of the conductive fluid can be kept without additionally needing a heating device.

Further, because the aforementioned non-solid liquid metal is with high cohesion/relative viscosity, before the petal portions 230 are tightly closed together, the portion 301 of the conductive fluid 300 seeping up from the flexible sleeve body 200 will be drawn back into the inner passage 260 of the flexible sleeve body 200 via the slits 220 by the remaining portion of the conductive fluid 300 in the flexible sleeve body 200. However, the disclosure is not limited to those materials mentioned above.

Furthermore, the disclosure is not limited that the conductive fluid has to be non-solid liquid metal at the room temperature, in other embodiments, although other conductive fluids may not be non-solid liquid metal at the room temperature, as long as a melting point of one of the other conductive fluids 300 is lower than a melting point of the flexible sleeve body 200, that is, in the premise of the flexible sleeve 200 not be melted and damaged, the conductive fluid 300 still can be heated to stay in a non-solid state.

However, the disclosure is not limited thereto, in other embodiments, if consequences of conductive fluid being partially stuck on a DUT are not concerned as an issue, a conductive fluid can be provided with non-conductive liquid colloid having high-density metal particles buried in the non-conductive liquid colloid.

Figure 5A:
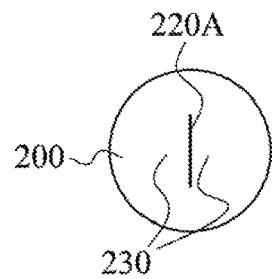
FIG. 5A to FIG. 5G are several types of slits formed on the flexible sleeve bodies according to some embodiments of the disclosure.
Figure 5B:
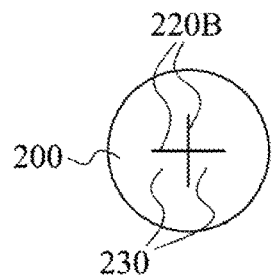
Figure 5C:
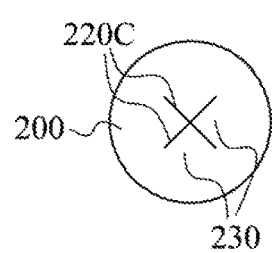
Figure 5D:
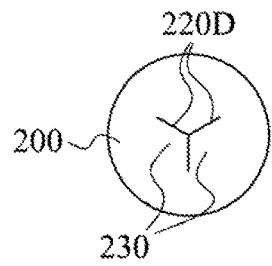
Figure 5E:
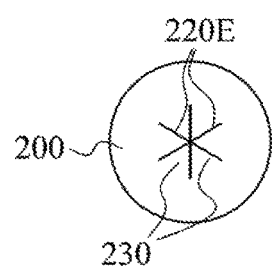
Figure 5F:
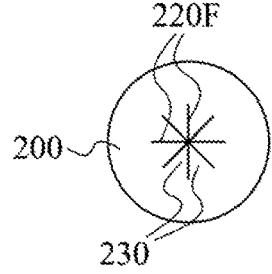
Figure 5G:
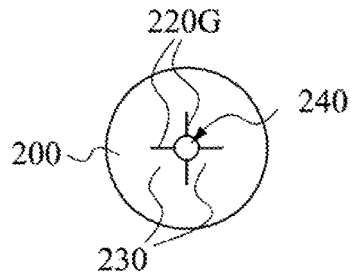

FIG. 5A to FIG. 5G are several types of slits formed on the flexible sleeve bodies 200 according to some embodiments of the disclosure. As the number of the slit described below starts from one to plural, as shown in FIG. 5A, the number of the slit 220A is one, a pattern of the slit 220A is shown as a horizontal line; as shown in FIG. 5B, the number of the slits 220B is two, a pattern of the slits 220B is shown as a cross shape; as shown in FIG. 5C, the number of the slits 220C is two, a pattern of the slits 220C is shown as a "X" shape; as shown in FIG. 50, the number of the slits 220D is three, a pattern of the slits 220D is shown as a "Y" shape; as shown in FIG. 5E, the number of the slits 220E is three, a pattern of the slits 2200 is shown as an asterisk (*) shape; or as shown in FIG. 5F, the number of the slits 220E is four, a pattern of the slits 220F is shown as a radial shape.

Therefore, since the number of the slit(s) 220A-220F determines the number of the petal portions 230, the greater the number of the petal portions 230, the larger amount of the conductive fluid 300 seeps up from the flexible sleeve body 200, thereby contacting a greater surface area of the second conductive contact 510.

Also, besides the petal portions 230 that are tightly closed to completely block the conductive fluid 300 from leaking out of the flexible sleeve body 200 in the embodiment described above, as shown in FIG. 5G, in another embodiment, other than the slits 220G, the end of the flexible sleeve body 200 is further provided with a penetrating hole 240 arranged on the slits 220G and connected to the slit 220G. Thus, the penetrating hole 240 exposes the conductive fluid 300 outwardly (FIG. 3).

Thus, no matter whether the slits 220G are pressed by the external force, the conductive fluid 300 can be moved in or out of the inner passage 260 through the penetrating hole 240 so as to control a basic in/out amount of the conductive fluid 300.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A probe connector, comprising:
   a probe body having a contacting portion;
   a flexible sleeve body connected to one end of the probe body opposite to the contacting portion;
   a conductive fluid received in the flexible sleeve body and electrically connected to the probe body; and
   at least one slit formed at one end of the flexible sleeve body opposite to the probe body, to define a plurality of petal portions which are configured to be tightly closed together,
   wherein, when the at least one slit is pressed to separate the petal portions, a portion of the conductive fluid seeps up from the flexible sleeve body via the at least one slit; and when the at least one slit is not pressed anymore, the portion of the conductive fluid returns back into the flexible sleeve body via the at least one slit.

2. The probe connector of claim 1, wherein the conductive fluid is liquid metal which is not solid under a room temperature.

3. The probe connector of claim 2, wherein the liquid metal comprises one or more materials selected from a group consisting of gallium, cesium, indium, mercury, tin, lead, zinc and bismuth.

4. The probe connector of claim 1, wherein a melting point of the conductive fluid is lower than a melting point of the flexible sleeve body.

5. The probe connector of claim 1, wherein the flexible sleeve body is provided with an inner passage for accommodating the conductive fluid, wherein the probe body hermetically closes one end of the inner passage.

6. The probe connector of claim 1, wherein a pattern of the at least one slit is a horizontal line slit, a cross shape slit, a "X" shape slit, an asterisk slit, a "Y shape slit or a radial slit.

7. The probe connector of claim 1, wherein the one end of the flexible sleeve body is further provided with a penetrating hole, and the penetrating hole is arranged on the at least one slit, connected to the at least one slit, and exposes the conductive fluid outwardly.

8. The probe connector of claim 1, wherein the probe body comprises:
   a conductive pin rod comprising a cylindrical body, a recess and an extending column, wherein the recess and the extending column are respectively formed on two opposite ends of the cylindrical body;
   a pin shaft retractably disposed in the recess, and partially extending outwards from the recess, wherein the contacting portion is disposed on one end of the pin shaft extending outwards from the recess; and
   an elastic member disposed in the recess and connected to the pin shaft and the cylindrical body.

9. A testing apparatus, comprising:
   a host;
   a testing circuit connected to the host, the testing circuit comprising a first conductive contact; and
   at least one probe connector, comprising:
      a probe body having a contacting portion electrically connected to the first conductive contact;
      a flexible sleeve body connected to one end of the probe body opposite to the contacting portion;
      a conductive fluid received in the flexible sleeve body and electrically connected to the probe body; and at least one slit formed on one end of the flexible sleeve body opposite to the probe body, so as to define a plurality of petal portions which are configured to be tightly closed together, wherein, when a device under test (DUT) presses the at least one slit to separate the petal portions from one second conductive contact of the DUT, a portion of the conductive fluid seeps up from the flexible sleeve body via the at least one slit and is electrically connected to the second conductive contact; and when the DUT does not press the at least one slit anymore, the portion of the conductive fluid returns back into the flexible sleeve body via the at least one slit.

10. The testing apparatus of claim 9, wherein the conductive fluid is liquid metal which is not solid under a room temperature.

11. The testing apparatus of claim 10, wherein the liquid metal comprises one or more materials selected from a group consisting of gallium, cesium, indium, mercury, tin, lead, zinc and bismuth.

12. The testing apparatus of claim 9, wherein a melting point of the conductive fluid is lower than a melting point of the flexible sleeve body.

13. The testing apparatus of claim 9, wherein the flexible sleeve body is provided with an inner passage for accommodating the conductive fluid, wherein the probe body seals one end of the inner passage.

14. The testing apparatus of claim 9, wherein a pattern of the at least one slit is a horizontal line slit, a cross shape slit, a "X" shape slit, an asterisk slit, a "Y" shape slit or a radial slit.

15. The testing apparatus of claim 9, wherein the flexible sleeve body is further provided with a penetrating hole, and the penetrating hole is arranged on the at least one slit, connected to the at least one slit, and exposes the conductive fluid outwardly.

16. The testing apparatus of claim 9, wherein the probe body comprises:
- a conductive pin rod comprising a cylindrical body, a recess and an extending column, wherein the recess and the extending column are respectively formed on two opposite ends of the cylindrical body;
- a pin shaft retractably disposed in the recess and partially extending outwards from the recess, wherein the contacting portion is disposed on one end of the pin shaft extending outwards from the recess; and
- an elastic member disposed in the recess and connected to the pin shaft and the cylindrical body.

* * * * *